United States Patent [19]

Murakami et al.

[11] Patent Number: 5,063,986
[45] Date of Patent: Nov. 12, 1991

[54] METHOD FOR MANUFACTURING ALLOY ROD HAVING GIANT MAGNETOSTRICTION

[75] Inventors: Katsuhiko Murakami; Nobuo Yamagami, both of Tokyo; Toshiyuki Nakanishi; Iwao Nakano, both of Yokosuka; Keiichi Kobayashi; Takashi Yoshikawa, both of Tokyo, all of Japan

[73] Assignees: NKK Corporation, Tokyo; Japan Marine Science and Technology Center, Yokosuka; Oki Electric Industry Co., Ltd., Tokyo, all of Japan

[21] Appl. No.: 539,604

[22] Filed: Jun. 18, 1990

[30] Foreign Application Priority Data

Jun. 30, 1989 [JP] Japan .................................. 1-168453

[51] Int. Cl.⁵ .............................................. B22D 27/04
[52] U.S. Cl. .................................. 164/122.2; 164/122.1
[58] Field of Search ........................... 164/122.1, 122.2

[56] References Cited

U.S. PATENT DOCUMENTS

| 3,759,310 | 9/1973 | Barrow et al. | 164/122.2 |
| 4,609,402 | 9/1986 | McMasters . | |
| 4,665,970 | 5/1987 | Ohno | 164/122.2 |

FOREIGN PATENT DOCUMENTS

| 0282059 | 9/1988 | European Pat. Off. . | |
| 3026661 | 2/1982 | Fed. Rep. of Germany | 164/122.2 |
| 53-64798 | 6/1978 | Japan . | |
| 62-109946 | 5/1987 | Japan . | |
| 63-286267 | 11/1988 | Japan | 164/122.2 |

OTHER PUBLICATIONS

J. D. Verhoeven et al., "The Growth of Single Crystal Terfenol-D Crystals", pp. 223-231, vol. 18A, Feb. 1987, Metallurgical Transaction A.

O. D. McMasters et al., "Single Crystal Growth by the Horizontal Levitation Zone Melting Method", pp. 577-583, Amsterdam, NL; vol. 43, 1978, Journal of Crystal Growth.

Primary Examiner—Kuang Y. Lin
Attorney, Agent, or Firm—Frishauf, Holtz, Goodman & Woodward

[57] ABSTRACT

A method for manufacturing an alloy rod having giant magnetostriction, which comprises the steps of: supplying a rod-shaped alloy material, comprising at least two rare earth metals including terbium and dysprosium and at least one transition metal, into a crucible moving downwardly at a speed of from 0.2 to 8.5 mm/minute in an inert gas atmosphere kept under a pressure of from 0.2 to 10 atm.; heating the rod-shaped alloy material in the circumferential direction thereof in the crucible by means of an annular high-frequency heating coil having a frequency of from 0.1 to 3 MHz and having an inside diameter of from 1.1 to 1.6 times as large as an outside diameter of the crucible, arranged so as to surround the crucible; continuously moving the heating from the lower end toward the upper end of the alloy material to locally and sequentially melt the alloy material in the axial direction thereof; and then locally and sequentially solidifying the resultant molten section of the alloy material in the crucible, thereby manufacturing an alloy rod having giant magnetostriction comprising a single-crystal structure or a unidirectional-solidification structure consistent with the axial line thereof.

12 Claims, 3 Drawing Sheets

METHOD FOR MANUFACTURING ALLOY ROD HAVING GIANT MAGNETOSTRICTION

REFERENCE TO PATENTS, APPLICATIONS AND PUBLICATIONS PERTINENT TO THE INVENTION

As far as we know, there are available the following prior art documents pertinent to the present invention:

(1) Japanese Patent Provisional Publication No.53-64,798 dated June 9, 1978; and (2) Japanese Patent Provisional Publication No.62-109,946 dated May 21, 1987.

The contents of the prior art disclosed in the above-mentioned prior art documents will be discussed hereafter under the heading of the "BACKGROUND OF THE INVENTION".

FIELD OF THE INVENTION

The present invention relates to a method for manufacturing an alloy rod having giant magnetostriction.

BACKGROUND OF THE INVENTION

An alloy rod having giant magnetostriction such as an amount of magnetostriction of, for example, at least $10^{-3}$ is now attracting the general attention as a material for elements of an electric audio converter, a vibrator, an actuator and the like, and industrialization thereof is under way. The alloy rod having such giant magnetostriction is usually manufactured by heat-treating a rod-shaped alloy material at a temperature slightly lower than the melting point thereof, or totally melting a granular or flaky alloy material and then solidifying the resultant melt of the alloy material into a rod shape.

An alloy comprising at least two rare earth metals including terbium (Tb) and dysprosium (Dy) and at least one transition metal is available as an alloy material for the alloy rod having such giant magnetostriction. As the above-mentioned alloy, an alloy having the following chemical composition is known in the product name of "Terfenol":

$Tb_X Dy_Y Fe_Z$ where, X, Y and Z are ratios of the number of atoms, taking respectively the following values:
X: from 0.25 to 0.35,
Y: from 0.60 to 0.80, and
Z: from 1.5 to 2.0.

For the manufacture of an alloy rod having giant magnetostriction, the following methods are known:

(1) A method for manufacturing an alloy rod having giant magnetostriction, disclosed in Japanese Patent Provisional Publication No.53-64,798 dated June 9, 1978, which comprises the steps of:

subjecting a rod-shaped alloy material having a chemical composition comprising $Tb_{0.28}Dy_{0.72}Fe_2$ to a heat treatment in an inert gas atmosphere, which heat treatment comprises heating said alloy material at a temperature slightly lower than the melting point thereof by means of an annular heater stationarily arranged so as to surround said alloy material while moving said alloy material in the axial direction thereof, thereby manufacturing an alloy rod having giant magnetostriction (hereinafter referred to as the "prior art 1").

(2) A method for manufacturing an alloy rod having giant magnetostriction, disclosed in Japanese Patent Provisional Publication No.62-109,946 dated May 21, 1987, which comprises the steps of:

receiving a rod-shaped alloy material having a chemical composition comprising $Tb_X Dy_{1-X} Fe_{1.5-2.0}$ (X being from 0.27 to 0.35) into a chamber made of quartz; moving an annular high-frequency heating coil, arranged so as to surround said chamber, from the lower end toward the upper end of the chamber to heat said rod-shaped alloy material in said chamber in the circumferential direction thereof; continuously moving said heating from the lower end toward the upper end of said alloy material in the axial direction thereof to locally and sequentially melt said alloy material in the axial direction thereof; and then, locally and sequentially solidifying the resultant molten section of said alloy material in said chamber, thereby manufacturing an alloy rod having giant magnetostriction (hereinafter referred to as the "prior art 2").

(3) A method, based on the conventional Bridgman method, for manufacturing an alloy rod having giant magnetostriction, which comprises the steps of:

supplying a granular or flaky alloy material, comprising at least two rare earth metals including terbium and dysprosium and at least one transition metal, into a crucible in an inert gas atmosphere placed in a vertical cylindrical heating furnace; melting said alloy material in said crucible in said heating furnace; and then, downwardly moving said crucible in the vertical direction to solidify and crystallize the resultant melt of said alloy material in said crucible at a lower portion of said heating furnace, thereby manufacturing an alloy rod having giant magnetostriction (hereinafter referred to as the "prior art 3").

FIG. 6 is a schematic descriptive view illustrating a typical apparatus used in the method of the prior art 3. As shown in FIG. 6, a tubular crucible 21 made of ceramics is supported vertically in a cylindrical heating furnace 16 by means of a crucible support 18 on the upper end of a vertical crucible supporting shaft 19. The crucible supporting shaft 19 projects downwardly through a sealing member 20 from the lower end of the heating furnace 16, and is vertically movable by means of a driving mechanism not shown. The heating furnace 16 has an electric-resistance heater 17 arranged so as to surround the heating furnace 16. The upper end of the heating furnace 16 is capable of being opened and closed by means of a cover not shown.

A granular or flaky alloy material comprising at least two rare earth metals including terbium and dysprosium and at least one transition metal is supplied into the crucible 21. The crucible 21 supplied with the alloy material is positioned by means of the crucible supporting shaft 19 at a portion of the heating furnace 16, where the electric-resistance heater 17 is arranged. The alloy material in the crucible 21 is heated by means of the electric-resistance heater 17 of the heating furnace 16 to totally melt the alloy material. Then, the crucible 21 is moved by means of the crucible supporting shaft 19 to a level lower than the portion of the heating furance 16, where the electric-resistance heater 17 is arranged, to cool the crucible 21, thereby solidifying the resultant melt 24 of the alloy material in the crucible 21 to manufacture an alloy rod.

FIG. 7 is a schematic descriptive view illustrating another apparatus used in the method of the prior art 3. The apparatus shown in FIG. 7 differs from the apparatus shown in FIG. 6 only in that an annular high-frequency heating coil 22 is arranged so as to surround the heating furnace 16, and that a cylindrical susceptor 23 made of a high-melting-point element such as carbon, molybdenum or tantalum is provided coaxially with the heating furnace 16 near the inner surface of a portion of the heating furnace 16, where the high-frequency heating coil 22 is arranged. According to the apparatus shown in FIG. 7, the alloy material in the crucible 21 is heated and melted by the radiation heat of the susceptor 23 caused by the high-frequency heating coil 22.

The above-mentioned prior art 1 has the following problems: A rod-shaped alloy material having a chemical composition comprising $Tb_xDy_yFe_z$ is brittle in general. Therefore, an alloy rod having giant magnetostriction manufactured by applying a heat treatment to the rod-shaped alloy material having such a chemical composition is also brittle and easily cracks. In addition, the heat treatment applied to the rod-shaped material requires a long period of time, thus leading to a low manufacturing efficiency.

The above-mentioned prior art 2 has the following problems: When locally and sequentially melting the rod-shaped alloy material in the axial direction thereof and then locally and sequentially solidifying the resultant molten section of the alloy material, the molten section is held between the not yet melted alloy material and the melted and solidified alloy rod under the effect of surface tension of the molten section. However, the $Tb_xDy_yFe_z$ alloy in a molten state has only a small surface tension, with a high density. When a diameter of the alloy material is large, therefore, the molten section between the not yet melted alloy material and the melted and solidified alloy rod falls down in the form of drops, thus making it impossible to manufacture the alloy rod. According to the experience of the inventors, a diameter of the alloy rod capable of being stably manufactured in accordance with this method is 10 mm on the maximum even when adjusting the frequency and the output power of the high-frequency heating coil for melting the alloy material. There is at present a demand for an alloy rod having giant magnetostriction, having a large diameter of over 10 mm, for use as elements for an electric audio converter, a vibrator, an actuator and the like having a large output. However, such a large-diameter alloy rod having giant magnetostriction cannot be manufactured by the prior art 2.

The above-mentioned prior art 3 has the following problems: When moving the crucible 21 in the heating furance 16 to a level lower than the portion of the heating furnace 16, where the electric-resistance heater 17 or the high-frequency heating coil 22 is arranged, for cooling of the crucible 21 to solidify the resultant melt 24 of the alloy material in the crucible 21, heat of the melt 24 is radiated diagonally downward outside the crucible 21 and the heating furnace 16 as indicated by the arrows in FIGS. 6 and 7. As a result, the interface between the melt 24 of the alloy material and the solidified mass 24' of the alloy rod in the crucible 21 takes the form of a concave surface on the side of the solidified mass 24', resulting in an inappropriate temperature gradient of the solidified mass 24' near the interface. Consequently, the solidified mass 24' of the alloy rod cannot have a single-crystal structure or a unidirectional-solidification structure consistent with the axial line thereof. It is therefore difficult to manufacture an alloy rod having giant magnetostriction by the prior art 3.

Under such circumstances, there is a strong demand for the development of a method for manufacturing stably at a high efficiency an alloy rod having a large diameter of over 10 mm and giant magnetostriction without causing cracks, but such a method has not as yet been proposed.

SUMMARY OF THE INVENTION

An object of the present invention is therefore to provide a method for manufacturing stably at a high efficiency an alloy rod having a large diameter of over 10 mm and giant magnetostriction without causing cracks.

In accordance with one of the features of the present invention, there is provided a method for manufacturing an alloy rod having giant magnetostriction, which comprises the steps of:

supplying a rod-shaped alloy material, comprising at least two rare earth metals including terbium and dysprosium and at least one transition metal, into a crucible moving downwardly at a prescribed speed in an inert gas atmosphere;

heating said rod-shaped alloy material in said crucible in the circumferential direction thereof by means of an annular high-frequency heating coil arranged so as to surround said crucible, continuously moving said heating from the lower end toward the upper end of said alloy material in the axial direction thereof to locally and sequentially melt said alloy material in the axial direction thereof, and then locally and sequentially solidifying the resultant molten section of said alloy material in said crucible, thereby manufacturing an alloy rod having giant magnetostriction comprising a single-crystal structure or a unidirectional-solidification structure consistent with the axial line thereof;

characterized in that:

said crucible is moved at a speed within a range of from 0.2 to 8.5 mm/minute in said inert gas atmosphere kept under a pressure within a range of from 0.2 to 10 atm.; and a frequency of said high-frequency heating coil is limited within a range of from 0.1 to 3 MHz, and an inside diameter of said high-frequency heating coil is limited within a range of from 1.1 to 1.6 times as large as an outside diameter of said crucible.

DETAILED DESCRIPTION OF PREFERRED EMBODIMENTS

From the above-mentioned point of view, extensive studies were carried out to develop a method for manufacturing stably at a high efficiency an alloy rod having a large diameter of over 10 mm and giant magnetostriction without causing cracks. As a result, the following findings were obtained. It is possible to stably manufacture at a high efficiency an alloy rod having giant magnetostriction, which comprises a single-crystal structure or a unidirectional-solidification structure consistent with the axial line thereof, by supplying a rod-shaped alloy material, comprising at least two rare earth metals including terbium and dysprosium and at least one transition metal, into a crucible moving downwardly at a speed of from 0.2 to 8.5 mm/minute in an inert gas atmosphere kept under a pressure of from 0.2 to 10 atm.; heating said rod-shaped alloy material in said crucible in the circumferential direction thereof by means of an annular high-frequency heating coil stationarily arranged so as to surround said crucible, which has a frequency of from 0.1 to 3 MHz and has an inside diameter of from 1.1 to 1.6 times as large as an outside diameter of said crucible; continuously moving said heating from the lower end toward the upper end of said alloy material in the axial direction thereof to locally and sequentially melt said alloy material in the axial direction thereof; and then locally and sequentially solidifying the resultant molten section of said alloy material in said crucible.

The present invention was made on the basis of the above-mentioned findings. Now, the method of the present invention for manufacturing an alloy rod having giant magnetostriction is described with reference to the drawings.

Figure 1:
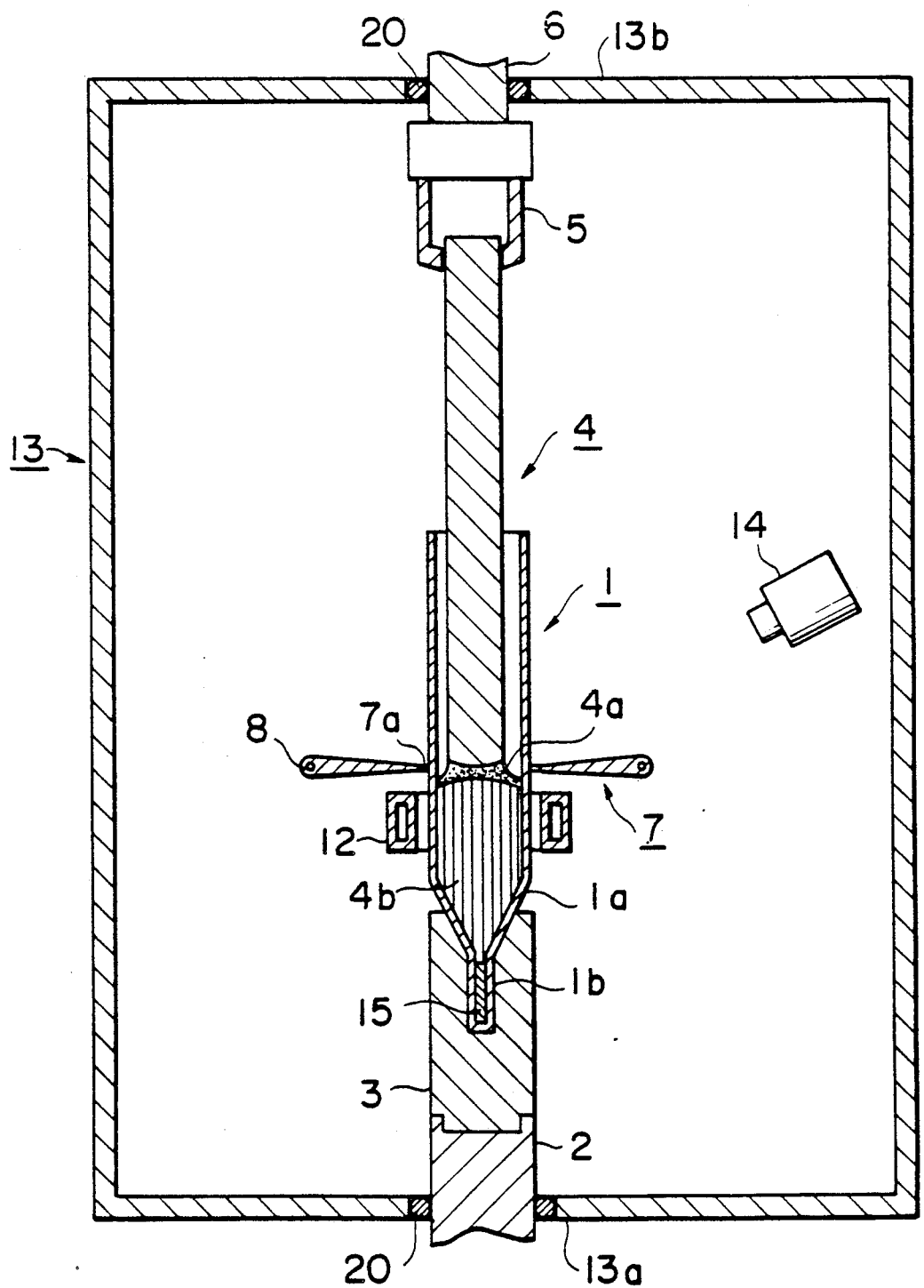
FIG. 1 is a schematic descriptive view illustrating an embodiment of the apparatus used in the method of the present invention.

FIG. 1 is a schematic descriptive view illustrating an embodiment of the apparatus used in the method of the present invention. As shown in FIG. 1, a tubular crucible 1 made of ceramics is supported substantially vertically in a chamber 13 in an inert gas atmosphere by means of a crucible support 3 made, for example, of boron nitride fitted to the upper end of a substantially vertical crucible supporting shaft 2. The crucible supporting shaft 2 projects downwardly through a sealing member 20 from a bottom wall 13a of the chamber 13, and is vertically movable by means of a driving mechanism not shown. The outside diameter of the crucible 1 is substantially equal to the diameter of crucible supporting shaft 2 and the crucible support 3. The crucible 1 moves downwardly under the action of the crucible supporting shaft 2. The crucible supporting shaft 2 can be rotated around the axis thereof by means of the driving mechanism not shown.

A rod-shaped alloy material 4 comprising at least two rare earth metals including terbium and dysprosium and at least one transition metal is supplied into the crucible 1. The upper end portion of the rod-shaped alloy material 4 is held by means of a chuck 5 fitted to the lower end of a substantially vertical alloy material supporting shaft 6. The alloy material supporting shaft 6 projects upwardly through a sealing member 20 from a top wall 13b of the chamber 13, and is vertically movable by means of a driving mechanism not shown. The rod-shaped alloy material 4 moves downwardly in the crucible 1 by means of the alloy material supporting shaft 6. Thus, the rod-shaped alloy material 4 is supplied at a prescribed speed into the crucible 1. The alloy material supporting shaft 6 can be rotated around the axis thereof by means of the driving mechanism not shown.

Figure 2:
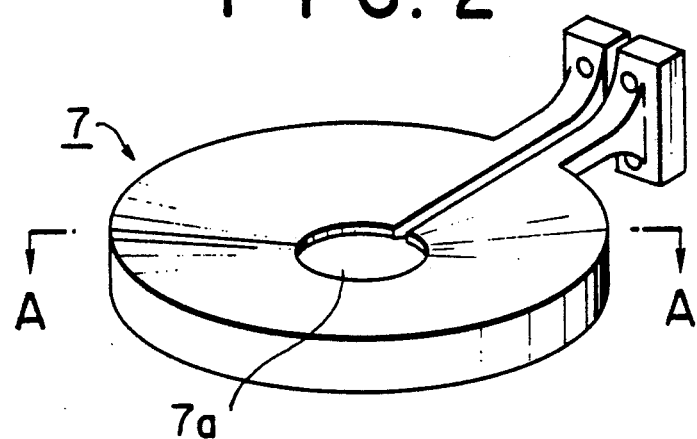
FIG. 2 is a schematic perspective view illustrating a typical high-frequency heating coil used in the apparatus shown in FIG. 1.
Figure 3:
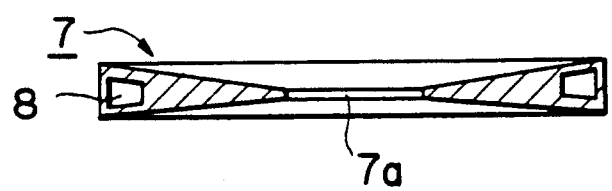
FIG. 3 is a schematic sectional view of FIG. 2 cut along the line A—A.
Figure 4:
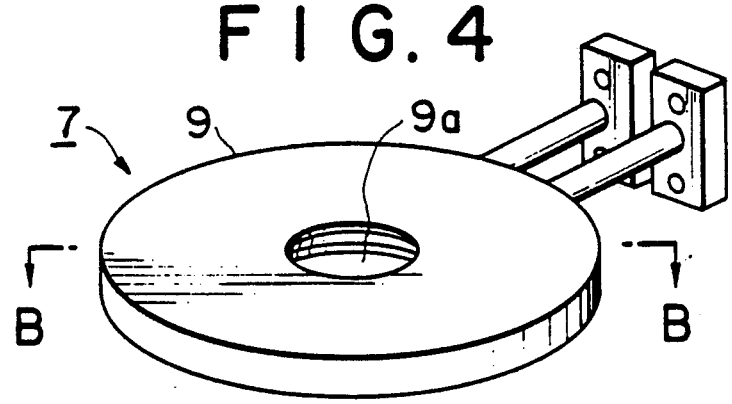
FIG. 4 is a schematic perspective view illustrating another high-frequency heating coil used in the apparatus shown in FIG. 1.
Figure 5:
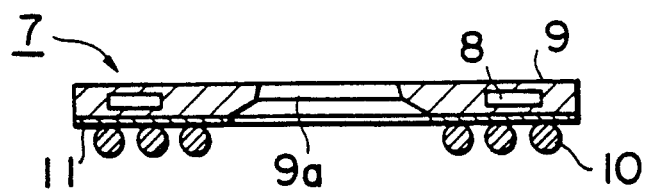
FIG. 5 is a schematic sectional view of FIG. 4 cut along the line B—B.
Figure 6:
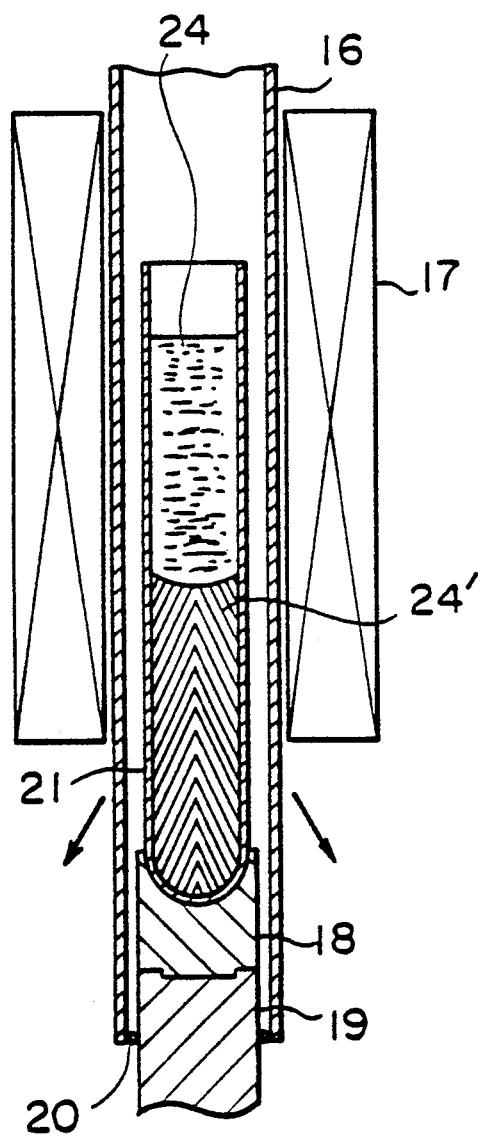
FIG. 6 is a schematic descriptive view illustrating a typical apparatus used in the method of the prior art 3.
Figure 7:
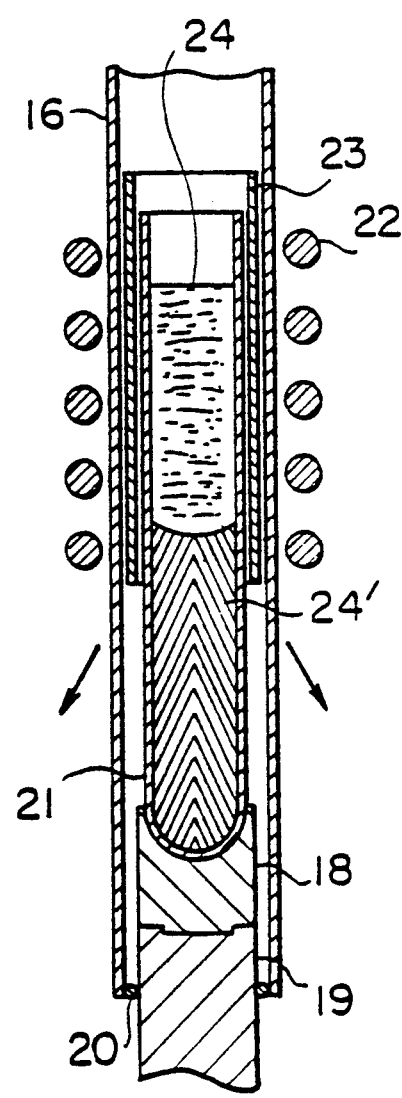
FIG. 7 is a schematic descriptive view illustrating another apparatus used in the method of the prior art 3.

For the purpose of heating the rod-shaped alloy material 4 in the crucible 1 in the circumferential direction thereof, an annular high-frequency heating coil 7 is stationarily arranged so as to surround the crucible 1. FIG. 2 is a schematic perspective view illustrating a typical high-frequency heating coil 7 used in the apparatus shown in FIG. 1, and FIG. 3 is a schematic sectional view of FIG. 2 cut along the line A—A. The high-frequency heating coil 7 shown in FIGS. 2 and 3 comprises an annular coil having, at the center thereof, a circular hole 7a for the insertion of the crucible 1, and a circulation hole 8 for cooling water is provided in the annular coil. FIG. 4 is a schematic perspective view illustrating another high-frequency heating coil 7 used in the apparatus shown in FIG. 1, and FIG. 5 is a schematic sectional view of FIG. 4 cut along the line B—B. The high-frequency heating coil 7 shown in FIGS. 4 and 5 comprises an annular short-circuit plate 9 having, at the center thereof, a circular hole 9a for the insertion of the crucible 1, and a spiral coil 10 fitted to the lower surface of the annular short-curcuit plate 9 through an annular insulation plate 11. A circulation hole 8 for cooling water is provided in the annular short-circuit plate 9.

The rod-shaped alloy material 4 is supplied at a prescribed speed by means of the alloy material supporting shaft 6 into the crucible 1 which moves downwardly at a prescribed speed by the action of the crucible supporting shaft 2. The rod-shaped alloy material 4 in the crucible 1 is heated in the circumferential direction thereof by means of the annular high-frequency heating coil 7 stationarily arranged so as to surround the crucible 1, and this heating is continuously moved from the lower end toward the upper end of the alloy material 4 in the axial direction thereof to locally and sequentially melt the alloy material 4 in the axial direction thereof. The resultant molten section 4a of the alloy material 4 is then locally and sequentially solidified in the crucible 1. An alloy rod is thus manufactured. In order that the thus manufactured alloy rod has giant magnetostriction, the alloy rod should have a single-crystal structure or a unidirectional-solidification structure consistent with the axial line thereof. The conditions for the method of the present invention for manufacturing the alloy rod having giant magnetostriction, which comprises a single-crystal structure or a unidirectional-solidification structure consistent with the axial line thereof, are described below.

The moving speed of the crucible 1 should be limited within a range of from 0.2 to 8.5 mm/minute. A moving speed of the crucible 1 of under 0.2 mm/minute leads to a low productivity and makes it impossible to manufacture an alloy rod at a high efficiency. A moving speed of the crucible 1 of over 8.5 mm/minutes, on the other hand, makes it difficult to solidify the molten section 4a of the rod-shaped alloy material 4 so as to achieve a single-crystal structure or a unidirectional-solidification structure consistent with the axial line thereof.

The frequency of the high-frequency heating coil 7 should be limited within a range of from 0.1 to 3 MHz. With a frequency of the high-frequency heating coil 7 of under 0.1 MHz, it is impossible to locally melt the rod-shaped alloy material 4 in the axial direction thereof, thus making it difficult to solidify the molten section 4a of the alloy material 4 so as to achieve a single-crystal structure or a unidirectional-solidification structure consistent with the axial line thereof. A frequency of the high-frequency heating coil 7 of over 3 MHz, on the other hand, results in a considerable loss of electricity.

The diameter of the circular hole 7a or 9a of the high-frequency heating coil 7, i.e., the inside diameter of the high-frequency heating coil 7 should be limited within a range of from 1.1 to 1.6 times as large as the outside diameter of the crucible 1. With an inside diameter of the high-frequency heating coil 7 of under 1.1 times as large as the outside diameter of the crucible 1, a trouble tends to occur in the movement of the crucible 1. With an inside diameter of the high-frequency heating coil 7 of over 1.6 times as large as the outside diameter of the crucible 1, on the other hand, it is impossible to locally melt the rod-shaped alloy material 4 in the axial direction thereof, thus making it difficult to solidify the molten section 4a of the alloy material 4 so as to achieve a single-crystal structure or a unidirectional-solidification structure consistent with the axial line thereof.

An alloy comprising at least two rare earth metals including terbium and dysprosium and at least one transition metal is very active. Therefore, the downwardly moving crucible 1, in which the rod-shaped alloy material 4 comprising such an active alloy is supplied and melted, and the molten section 4a thereof is solidified, should be kept in an inert gas atmosphere under a pressure within a range of from 0.2 to 10 atm. In the apparatus shown in FIG. 1, the chamber 13 is kept in an inert gas atmosphere under a pressure within the above-mentioned range. With a pressure of the inert gas atmosphere of under 0.2 atm., volatile dysprosium in the molten section 4a of the alloy material 4 evaporates, thus causing the problem of changes in the chemical composition of a solidified mass 4b. A pressure of the inert gas atmosphere of over 10 atm., on the other hand, causes safety problems in operation.

A preferable chemical composition of the rod-shaped alloy material 4 for obtaining an alloy rod having giant magnetostriction is as follows:

$$Tb_X Dy_Y Fe_Z$$

where, X, Y and Z are ratios of the number of atoms, taking respectively the following values:
X: from 0.25 to 0.35,
Y: from 0.60 to 0.80, and
Z: from 1.5 to 2.0.

It is necessary to control a feeding rate of the rod-shaped alloy material 4 into the crucible 1 in response to the moving speed of the crucible 1 so that an amount of the molten section 4a of the alloy material 4 in the crucible 1 is not excessive or short relative to the inner volume of the crucible 1. Such a feeding rate of the alloy material 4 can be determined in accordance with the following formula:

$$V_2 V_1 R_1^2 / R_2^2$$

where,
$V_1$: moving speed of the crucible 1,
$V_2$: feeding rate of the alloy material 4,
$R_1$: inside diameter of the crucible 1, and
$R_2$: diameter of the alloy material 4.

In order to avoid the above-mentioned excess or shortage of the amount of the molten section 4a of the alloy material 4 in the crucible 1, it is desirable to control also the output of the high-frequency heating coil 7.

A bottom 1a of the crucible 1 should preferably be formed into an inverted cone shape having an angle within a range of from 30° to 100°. When the bottom 1a of the crucible 1 is thus formed into an inverted cone shape, it is possible to promote production of crystal nuclei and growth of a single-crystal structure. An angle of under 30° of the inverted cone shape of the bottom 1a leads to an unnecessarily long bottom 1a. An inverted cone-solidified mass 4b solidified in such a long inverted cone-shaped bottom 1a has to be trimmed away. An angle of under 30° of the inverted cone shape of the bottom 1a therefore increases the amount of trimming of the solidified mass 4b, thus leading to a lower product yield. An angle of over 100° of the inverted cone shape of the bottom 1a, on the other hand, makes it impossible to promote production of crystal nuclei and growth of a single-crystal structure as described above.

It is desirable to form an elongated vertical recess 1b having, for example, a diameter of from 1 to 5 mm and a depth of from 10 to 50 mm, on the bottom 1a of the crucible 1 formed into the inverted cone shape, and to fill the thus formed recess 1b with a seed crystal 15 having the same chemical composition as that of the alloy material 4 and having the <111> orientation or the <112> orientation. Filling the recess 1b with the seed crystal 15 promotes growth of crystals having the <111> orientation or the <112> orientation excellent in magnetostrictive property in the alloy rod. When the molten section 4a of the rod-shaped alloy material 4 comprising at least two rare earth metals including terbium and dysprosium and at least one transition metal is solidified, crystals having the <112> orientation preferentially grow. The crystals having the <112> orientation have a magnetostrictive property closely approximating to that of crystals having the <111> orientation, which have the most excellent magnetostrictive property. Therefore, an alloy rod having almost satisfactory giant magnetostriction is available without using the above-mentioned seed crystal 15.

An alloy comprising at least two rare earth metals including terbium and dysprosium and at least one transition metal is very active as described above. Therefore, the crucible 1, in which the rod-shaped alloy material 4 comprising such an active alloy is melted and the molten section 4a of the alloy material 4 is solidified, should preferably be formed of ceramics mainly comprising at least one of quartz ($SiO_2$), pyrolytic boron nitride (P-BN), calcium oxide (CaO), yttrium oxide ($Y_2O_3$), zirconium oxide ($ZrO_2$), aluminum oxide ($Al_2O_3$) and magnesium oxide (MgO).

When locally and sequentially melting the rod-shaped alloy material 4 in the axial direction thereof in the crucible 1 and locally and sequentially solidifying the resultant molten section 4a of the alloy material 4 in the crucible 1, an amount of the molten section 4a should not be excessive or short, as described above. For this purpose, it is desirable to monitor the position and the state of the molten section 4a of the rod-shaped alloy material 4 in the crucible 1 by means of a thermal imaging system 14 as shown in FIG. 1 to manually or automatically control at least one of the moving speed of the crucible 1 and the feeding rate of the rod-shaped alloy material 4. In this case, the crucible 1 should preferably be formed of ceramics mainly comprising pyrolytic boron nitride (P-BN) which allows passage of infrared rays.

As described above, the crucible 1 is downwardly moved at a speed within a range of from 0.2 to 8.5 mm/minute in an inert gas atmosphere kept under a pressure within a range of from 0.2 to 10 atm., and the rod-shaped alloy material 4 comprising at least two rare earth metals including terbium and at least one transition metal is supplied into the thus moving crucible 1 at such a feeding rate that an amount of the molten section 4a of the alloy material 4 is not excessive or short. The rod-shaped alloy material 4 in the crucible 1 is heated in the circumferential direction thereof by means of the annular high-frequency heating coil 7 stationarily arranged so as to surround the crucible 1, which has an inside diameter within a range of from 1.1 to 1.6 times as large as an outside diameter of the crucible 1 and has a frequency within a range of from 0.1 to 3 MHz. This heating is continuously moved from the lower end toward the upper end of the alloy material 4 in the axial direction thereof to locally and sequentially melt the alloy material 4 in the axial direction thereof, and then the resultant molten section 4a of the alloy material 4 is locally and sequentially solidified in the crucible 1. As a result, the interface between the molten section 4a of the alloy material 4 and the solidified mass 4b of the alloy rod in the crucible 1 takes the form of a convex surface on the side of the solidified mass 4b, resulting in a proper temperature gradient of the solidified mass 4b near the interface. Thus, an alloy rod having giant magnetostriction, comprising a single-crystal structure or a unidirectional-solidification structure consistent with the axial line thereof is manufactured.

When the interface between the molten section 4a of the rod-shaped alloy material 4 and the solidified mass 4b of the alloy rod in the crucible 1 is hard to take the form of a convex surface on the side of the solidified mass 4b, and the temperature gradient of the solidified mass 4b near the interface is inappropriate, it is recommended to arrange an annular short-circuit plate 12 made of copper, in which cooling water circulates, so as to surround the crucible 1 directly below the high-frequency heating coil 7, as shown in FIG. 1.

Now, the method of the present invention for manufacturing an alloy rod having giant magnetostriction is described more in detail by means of an example.

EXAMPLE

An alloy rod having giant magnetostriction was manufactured as follows with the use of the apparatus as shown in FIG. 1. The crucible 1 made of ceramics mainly comprising pyrolytic boron nitride (P-BN), having the bottom 1a formed into an inverted cone shape with an angle of 60°, and having the elongated vertical recess 1b on the bottom 1a, was placed on the crucible support 3 of the crucible supporting shaft 2. The crucible 1 had the following dimensions:
Inside diameter of the crucible 1: 32 mm,
Outside diameter of the crucible 1: 34 mm,
Height of the crucible 1: 200 mm,
Diameter of the recess 1b: 3.5 mm, and
Depth of the recess 1b: 30 mm.

The rod-shaped alloy material 4 having a chemical composition comprising $Tb_{0.3}Dy_{0.7}Fe_{1.9}$ and the following dimensions was supplied into the crucible 1:
Diameter of the alloy material 4: 25 mm, and
Length of the alloy material 4: 250 mm.

The recess 1b of the crucible 1 was filled with the seed crystal 15 having a chemical composition comprising $Tb_{0.3}Dy_{0.7}Fe_{1.9}$ and having the <111> orientation and the following dimensions:
Diameter of the seed crystal 15: 3 mm, and
Length of the seed crystal 15: 25 mm.

The high-frequency heating coil 7 as shown in FIGS. 2 and 3, having the following frequency, output and inside diameter, was stationarily arranged so as to surround the crucible 1:
Frequency: 1.2 MHz,
Output: 18.5 kW, and
Inside diameter: 40 mm.

The interior of the chamber 13 was maintained in an argon gas atmosphere kept under a pressure of 2 atm. The annular short-circuit plate 12 was not used.

The crucible 1 was positioned by means of the crucible supporting shaft 2 so that the recess 1b of the crucible 1 was directly below the high-frequency heating coil 7. Then, the rod-shaped alloy material 4 was positioned in the crucible 1 by means of the alloy material supporting shaft 6 so that the lower end of the alloy material 4 was directly above the high-frequency heating coil 7. Then, power was turned on to the high-frequency heating coil 7 to melt the lower end of the alloy material 4, and then the alloy material 4 was moved slightly downwardly to weld the thus melted lower end of the alloy material 4 to the seed crystal 15 in the recess 1b. Then, the crucible 1 was moved downwardly at a speed of 2.4 mm/minute by means of the crucible supporting shaft 2 while rotating the crucible 1 clockwise at a rotating speed of 5 rpm around the axial line thereof. On the other hand, the rod-shaped alloy material 4 was supplied into the crucible 1 at a feeding rate of 3.9 mm/minute by means of the alloy material supporting shaft 6 while rotating the alloy material 4 counterclockwise at a rotating speed of 2 rpm around the axial line thereof. The state of melting of the rod-shaped alloy material 4 was monitored by means of the thermal imaging system 14 to make fine adjustment of the feeding rate of the alloy material 4. As a result, the rod-shaped alloy material 4 heated in the circumferential direction thereof in the crucible 1 was locally and sequentially melted in the axial direction thereof, and the resultant molten section 4a of the alloy material 4 was then locally and sequentially solidified in the crucible 1. Thus, an alloy rod having a diameter of 32 mm and having giant magnetostriction as represented by an amount of magnetostriction of at least $10^{-3}$ was manufactured at a high efficiency without causing cracks.

According to the method of the present invention, as described above in detail, it is possible to stably manufacture at a high efficiency an alloy rod having a large diameter of over 10 mm and giant magnetostriction without causing cracks, thus providing industrially useful effects.

What is claimed is:

1. A method for manufacturing an alloy rod having giant magnetostriction, which comprises the steps of:
   supplying a rod-shaped alloy material, comprising at least two rare earth metals comprising terbium and dysprosium and at least one transition metal, into a crucible in an inert gas atmosphere under a pressure of 0.2 to 10 atmospheres;
   heating said rod-shaped alloy material in said crucible in the circumferential direction thereof by means of an annular high-frequency heating coil having a frequency of 0.1 to 3 MHz and arranged so as to surround said crucible, said high-frequency heating coil having an inside diameter of 1.1 to 1.6 times as large as an outside diameter of said crucible, continuously moving said crucible downwardly at a speed of 0.2 to 8.5 mm/minute through said heating coil so as to heat from the lower end toward the upper end of said alloy material in the axial direction thereof to locally and sequentially melt a section of said alloy material in the axial direction thereof, and then locally and sequentially solidifying the resultant molten section of said alloy material in said crucible, thereby manufacturing an alloy rod having giant magnetostriction comprising a single-crystal structure or a unidirectional-solidification structure in the axial direction thereof.

2. The method as claimed in claim 1, wherein: said rod-shaped alloy material has a chemical composition comprising:

$$Tb_X Dy_Y Fe_Z$$

where, X, Y and Z are ratios of the number of atoms, having respectively the following values:
X: from 0.25 to 0.35,
Y: from 0.60 to 0.80, and
Z: from 1.5 to 2.0.

3. The method as claimed in claim 1, wherein: said rod-shaped alloy material is fed into said crucible at a feeding rate as determined in accordance with the following formula:

$$V_2 = V_1 R_1^2 / R_2^2$$

where,
$V_1$: moving speed of said crucible,
$V_2$: feeding rate of said alloy material,
$R_1$: inside diameter of said crucible, and
$R_2$: diameter of said alloy material.

4. The method as claimed in claim 1, wherein: a bottom of said crucible is formed into an inverted cone shape having an angle within a range of from 30° to 100°.

5. The method as claimed in claim 4, wherein: an elongated vertical recess is formed on said bottom of said crucible, which bottom is formed into said inverted cone shape, and said recess is filled with a seed crystal having the same chemical composition as that of said rod-shaped alloy material and having the <111> orientation or the <112> orientation.

6. The method as claimed in claim 1, wherein: said crucible is formed of ceramics mainly comprising at least one of quartz ($SiO_2$), pyrolytic boron nitride (P-BN), calcium oxide (CaO), yttrium oxide ($Y_2O_3$), zirconium oxide ($ZrO_2$), aluminum oxide ($Al_2O_3$) and magnesium oxide (MgO).

7. The method as claimed in claim 1, wherein: said melting of said rod-shaped alloy material in said crucible is monitored by means of a thermal imaging system to control at least one of the moving speed of said crucible and the feeding rate of said alloy material.

8. The method as claimed in claim 5, wherein: said rod-shaped alloy material has a chemical composition comprising:

$$Tb_X Dy_Y Fe_Z$$

where, X, Y and Z are ratios of the number of atoms, having respectively the following values:
X: from 0.25 to 0.35,
Y: from 0.60 to 0.80, and
Z: from 1.5 to 2.0.

9. The method as claimed in claim 8, wherein: said rod-shaped alloy material is fed into said crucible at a feeding rate as determined in accordance with the following formula:

$$V_2 = V_1 R_1^2 / R_2^2$$

where,
$V_1$: moving speed of said crucible,
$V_2$: feeding rate of said alloy material,
$R_1$: inside diameter of said crucible, and
$R_2$: diameter of said alloy material.

10. The method as claimed in claim 9, wherein: said crucible is formed of ceramics selected from the group consisting of quartz, pyrolytic boron nitride, calcium oxide, yttrium oxide, zirconium oxide, aluminum oxide, magnesium oxide and mixture thereof.

11. The method as claimed in claim 10, wherein: said melting of said rod-shaped alloy material in said crucible is monitored by means of a thermal imaging system to control at least one of the moving speed of said crucible and the feeding rate of said alloy material.

12. The method as claimed in claim 1, wherein the crucible is made of a material comprising pyrolytic boron nitride, the alloy material is $Tb_{0.3}Dy_{0.7}Fe_{1.9}$, the frequency of the high frequency heating coil is 1.2 MHz, the crucible is moved at a speed of 2.5 mm/minute and is rotated clockwise at a rotating speed of 5 rpm, the rod-shaped alloy material is fed at a rate of 3.9 mm/minute, the inert gas atmosphere comprises argon at a pressure of 2 atmospheres and the alloy material is rotated counterclockwise at a rotating speed of 2 rpm.

* * * * *